(12) United States Patent
Chou et al.

(10) Patent No.: US 7,663,154 B2
(45) Date of Patent: Feb. 16, 2010

(54) BACKLIGHT MODULE AND LIGHT EMITTING DIODE PACKAGE STRUCTURE THEREFOR

(75) Inventors: Wei-Jen Chou, Hsinchu (TW); Wei-Chih Wang, Hsinchu (TW)

(73) Assignee: Young Lighting Technology Corporation, Hsinchu (TW)

( * ) Notice: Subject to any disclaimer, the term of this patent is extended or adjusted under 35 U.S.C. 154(b) by 130 days.

(21) Appl. No.: 11/870,129

(22) Filed: Oct. 10, 2007

(65) Prior Publication Data

US 2008/0303040 A1 Dec. 11, 2008

(30) Foreign Application Priority Data

Jun. 5, 2007 (TW) ............................... 96120075 A

(51) Int. Cl.
*H01L 31/048* (2006.01)
(52) U.S. Cl. .................... 257/99; 257/98; 257/E33.001; 257/433; 257/678; 362/97.1; 362/600; 362/612; 362/613; 362/341; 349/61
(58) Field of Classification Search .................. 257/98, 257/99, E33.001, 433, 678; 362/97.1, 600, 362/612, 613; 349/61
See application file for complete search history.

(56) References Cited

U.S. PATENT DOCUMENTS 6,642,547 B2 * 11/2003 Matsubara et al. ............ 257/98

2006/0279216 A1 * 12/2006 Kim et al. .................... 313/631
2007/0109779 A1 * 5/2007 Sekiguchi et al. ........... 362/249
2008/0173883 A1 * 7/2008 Hussell et al. ................ 257/98

FOREIGN PATENT DOCUMENTS

TW            I237406        8/2005

* cited by examiner

*Primary Examiner*—Davienne Monbleau
*Assistant Examiner*—Hajar Kolahdouzan
(74) *Attorney, Agent, or Firm*—J.C. Patents

(57) ABSTRACT

A LED package structure including a carrier, LED chips, and a package body is provided. The carrier defines a cave with two opposite first side walls, two opposite second side walls and a rectangular bottom surface. An included angle between the first side wall and the bottom surface differs from that between the second side wall and the bottom surface. The LED chips are disposed in a straight-line arrangement on a center line of the bottom surface and electrically connected to the carrier. The center line is parallel to a long side of the bottom surface. The package body is formed on the carrier to cover the LED chips. Since the included angle between the first side wall and the bottom surface differs from that between the second side wall and the bottom surface, light provided by the LED package structure has different spatial radiation patterns in different directions.

17 Claims, 7 Drawing Sheets

BACKLIGHT MODULE AND LIGHT EMITTING DIODE PACKAGE STRUCTURE THEREFOR

CROSS-REFERENCE TO RELATED APPLICATION

This application claims the priority benefit of Taiwan application serial no. 96120075, filed on Jun. 5, 2007. All disclosure of the Taiwan application is incorporated herein by reference.

BACKGROUND OF THE INVENTION

1. Field of the Invention

The present invention relates to a package structure, and more particularly to a backlight module and a light emitting diode (LED) package structure thereof.

2. Description of Related Art

In recent years, since luminescence efficiency of LEDs has been constantly upgraded, fluorescent lamps and incandescent bulbs are gradually replaced with the LEDs in some fields, such as a scanning light source which requires high reaction speed, a backlight source of a liquid crystal display (LCD), car instrument panel illumination, traffic signs and general illumination devices.

The LEDs is point light sources. Thus, as the LEDs are applied to the backlight sources of the LCDs, the LEDs are arranged in array in most cases, and light beams provided by the backlight sources are uniformly mixed before the light beams are transmitted to LCD panels, so as to provide planar light sources emitting uniformly-mixed white light beams for the LCD panels. Here, as the LEDs are applied to edge-type backlight modules, a Lambertian LED package structure 100a (shown in FIGS. 1A and 1B) characterized by converged light beams or a batwing LED package structure 100b (shown in FIGS. 2A and 2B) is usually adopted.

Taking the backlight source composed of one or more Lambertian LED package structures 100a adapted to emit red lights, green lights or blue lights for an example, when a pitch among each of the LED package structures 100a is 9 mm, the light beams provided by the LED package structures 100a require a 28-mm light-mixing distance for mixing the light beams into the uniform white light beams. However, since the pitch among each of the LED package structures 100a is almost unlikely to be shortened by virtue of the volume of the LED package structures 100a, the light-mixing distance thereof is not likely to be shortened as well. Accordingly, the volume of the backlight module cannot be reduced.

In order to reduce the light-mixing distance of the light beams provided by the LED package structures 100a, an LED package structure 100c (shown in FIGS. 3A and 3B) having three chips is proposed by the related art. The LED package structure 100c has a red LED chip 110r, a green LED chip 110g, and a blue LED chip 110b. The LED chips 110r, 110g, and 110b are disposed in the same chamber 120. Thus, the light beams provided by the LED chips 110r, 110g, and 110b can be mixed in the chamber 120 at first and then projected out of the LED package structure 100c. As such, the light beams supplied by the LED package structure 100c have a relatively short light-mixing distance than the backlight source constituted by the LED package structures 100a does. Here, said light-mixing distance is 18 mm.

It should be noted that the square-shaped chamber 120 of the LED package structure 100c cannot achieve a converged effect, and hence the light beams provided by the LED package structure 100c may have a relatively short transmitting distance. Moreover, the degree of the luminance of the planar light source is larger nearby a light incident surface of a light guide plate (not shown) than away from the light incident surface thereof. Accordingly, as the LED package structure 100c is employed together with a large-sized light guide plate, unfavorable light uniformity may be achieved in an edge area of the planar light source emitted from a light emitting surface of the light guide plate.

SUMMARY OF THE INVENTION

The present invention is directed to provide an LED package structure, such that light beams provided thereby have different spatial radiation patterns in different directions. Further, a light-mixing distance required by the LED package structure is shortened, and light intensity of the LED package structure is improved.

Other purposes and advantages of the present invention can be further comprehended through the technical features disclosed in the present invention.

In an embodiment of the present invention, a LED package structure including a carrier, a plurality of LED chips and a package body is provided. The carrier defines a cave with two opposite first side walls, two opposite second side walls and a rectangular bottom surface. Here, an included angle between each of the first side walls and the bottom surface is different from that between each of the second side walls and the bottom surface. The LED chips are disposed in a straight-line arrangement on a center line of the bottom surface and are electrically connected to the carrier. The center line is parallel to a long side of the bottom surface. The package body is formed on the carrier to cover the LED chips.

In an embodiment of the present invention, a backlight module including a light guide device, a circuit board and a plurality of the LED package structures is further provided. The light guide device has a light incident surface and a light emitting surface. Each of the LED package structures is electrically connected to the circuit board and is adapted to provide a light beam incident into the light guide device through the light incident surface.

Since the included angle between each of the first side walls and the bottom surface is different from that between each of the second side walls and the bottom surface, the light beam provided by the LED package structure may have different spatial radiation patterns in different directions. The light beams reflected by the first side walls may construct the spatial radiation patterns having a desired scattering effect. Hence, as a plurality of the LED package structures is disposed together, the light beams provided thereby may have a relatively short light-mixing distance after reflected by the first side walls. Moreover, the light beams reflected by the second side walls may construct the spatial radiation patterns having a desired focus effect. Therefore, the light beams provided by the LED package structures may have a rather long light-transmitting distance after reflected by the second side walls.

Other objectives, features and advantages of the present invention will be further understood from the further technological features disclosed by the embodiments of the present invention wherein there are shown and described preferred embodiments of this invention, simply by way of illustration of modes best suited to carry out the invention.

DESCRIPTION OF EMBODIMENTS

It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein are meant to encompass the items listed thereafter and equivalents thereof as well as additional items. Unless limited otherwise, the terms "connected," and variations thereof herein are used broadly and encompass direct and indirect connections.

Figure 1A:
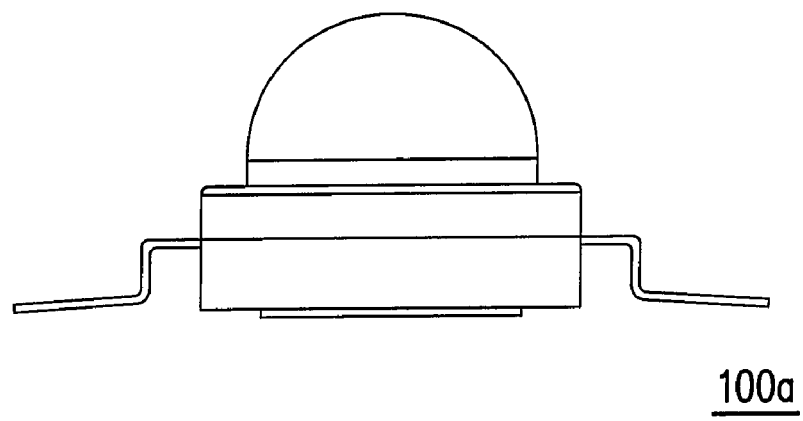
FIG. 1A is a schematic view of a conventional Lambertian LED package structure.
Figure 1B:
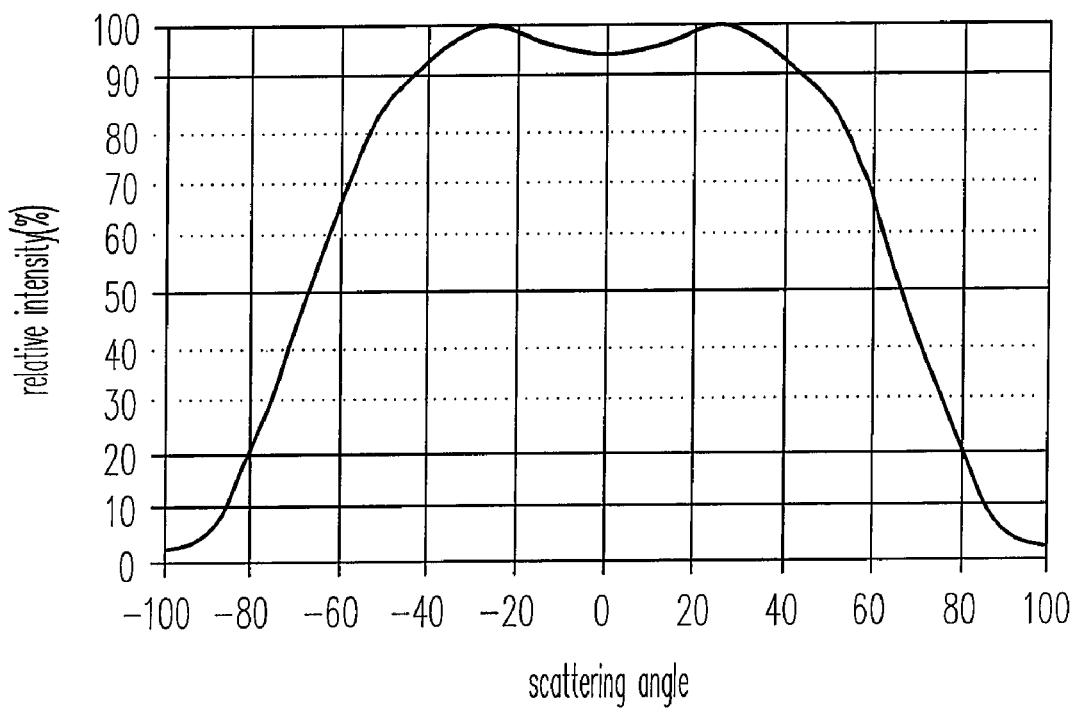
FIG. 1B is a diagram shows a curve relating light energy of light beams provided by the Lambertian LED package structure of FIG. 1A to a scattering angle of said light beams.
Figure 2A:
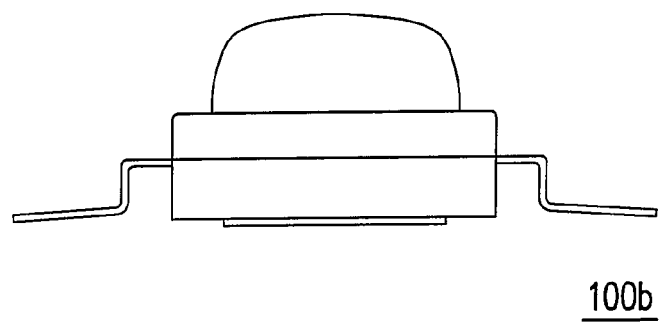
FIG. 2A is a schematic view of a conventional batwing LED package structure.
Figure 2B:
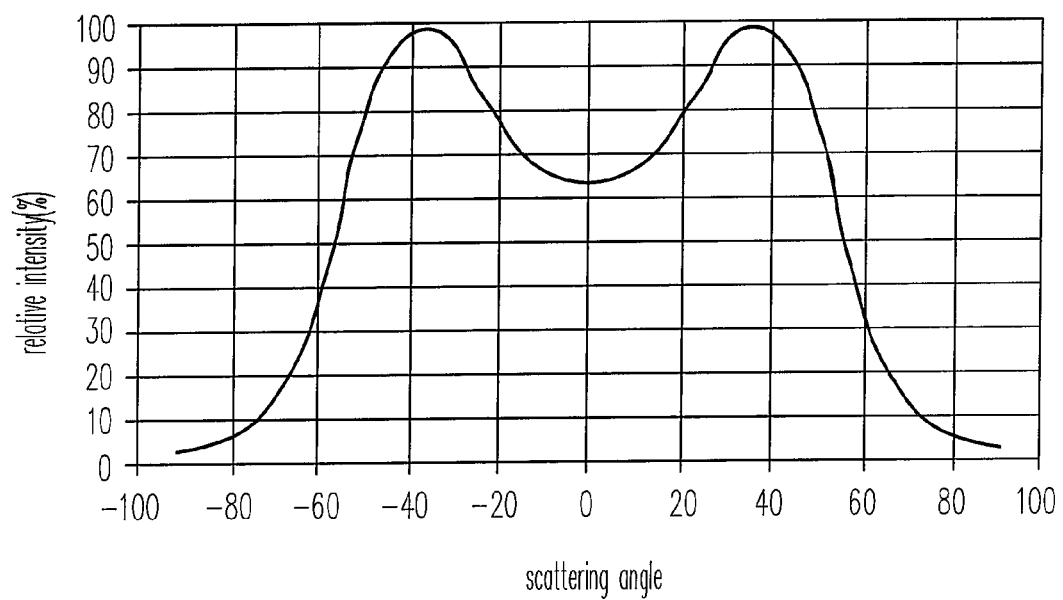
FIG. 2B is a diagram shows a curve relating light energy of light beams provided by the batwing LED package structure of FIG. 2A to a scattering angle of said light beams.
Figure 3A:
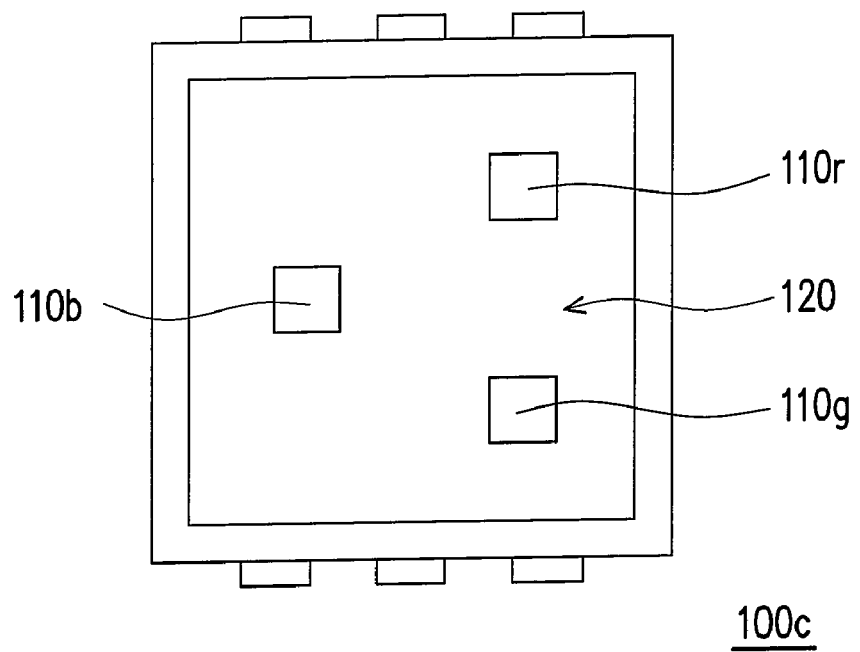
FIG. 3A is a top view of a conventional LED package structure having three chips.
Figure 3B:
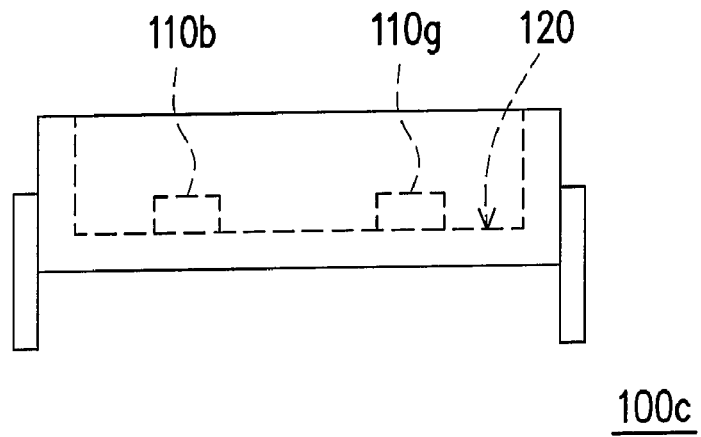
FIG. 3B is a side view of FIG. 3A.
Figure 4A:
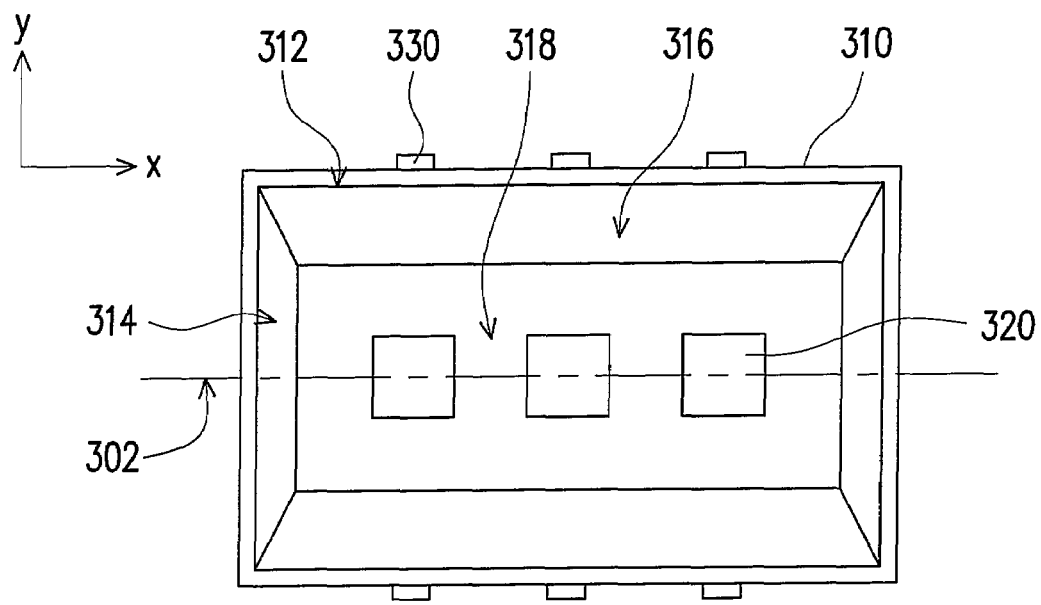
FIG. 4A is a top view of an LED package structure according to an embodiment of the present invention.
Figure 4B:
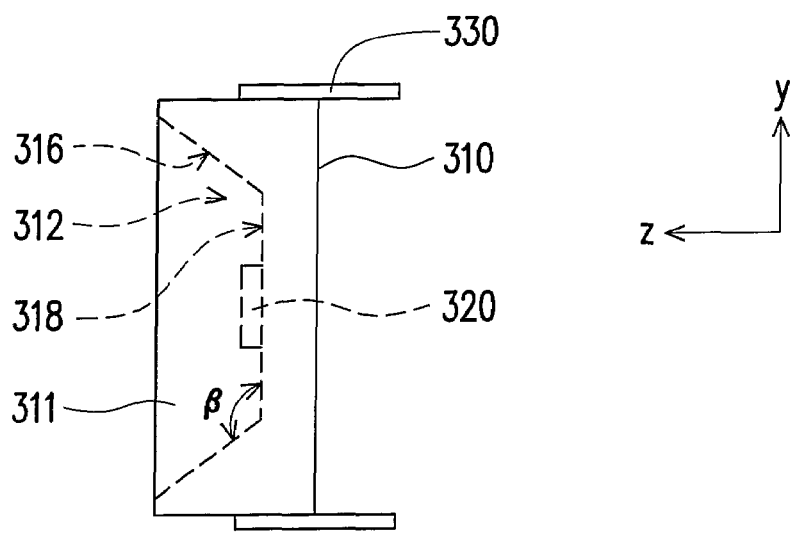
FIG. 4B is a side view of FIG. 4A.
Figure 4C:
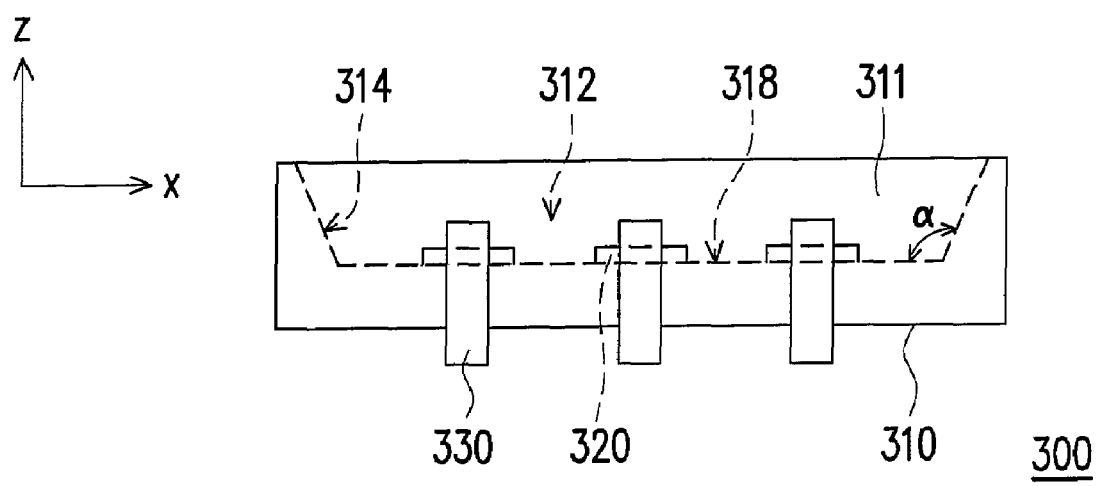
FIG. 4C is a front view of FIG. 4A.

Referring to FIGS. 4A through 4C, in an embodiment of the present invention, an LED package structure 300 including a carrier 310, a plurality of LED chips 320 and a package body 311 is provided. The carrier 310 defines a cave 312 with two opposite first side walls 314, two opposite second side walls 316 and a rectangular bottom surface 318. Here, an included angle $\alpha$ between each of the first side walls 314 and the bottom surface 318 is different from an included angle $\beta$ between each of the second side walls 316 and the bottom surface 318. Besides, the LED chips 320 are disposed in a straight-line arrangement on a center line 302 (shown in FIG. 4A) of the bottom surface 318 and are electrically connected to the carrier 310. The center line 302 is parallel to a long side of the bottom surface 318. The package body 311 is formed on the carrier 310 to cover the LED chips 320.

In the present embodiment, the long side of the bottom surface 318 is, for example, parallel to an X-axis direction, while a short side of the bottom surface 318 is, for example, parallel to a Y-axis direction. Moreover, a normal of the bottom surface 318 is, for example, parallel to a Z-axis direction. Therefore, the first side walls 314 are connected to the short side of the bottom surface 318 and parallel to the Y-axis direction, whereas the second side walls 316 are connected to the long side of the bottom surface 318 and parallel to the X-axis direction. In addition, the included angle $\alpha$ is, for example, larger than 90 degrees but less than the included angle $\beta$.

Both the included angles $\alpha$ and $\beta$ exceed 90 degrees. Accordingly, when the light beams provided by the LED chips 320 are transmitted to the first side walls 314 and the second side walls 316, the light beams may be reflected by the first side walls 314 and the second side walls 316, such that the light beams are converged, and that a light-transmitting distance of the light beams is further increased. Moreover, the included angle $\alpha$ is different from the included angle $\beta$. Therefore, as the light beams are transmitted to the first side walls 314 and the second side walls 316, the light beams may be reflected by the first side walls 314 and the second side walls 316, respectively, and different spatial radiation patterns are formed accordingly.

Note that the included angles $\alpha$ and $\beta$ may be adjusted on the basis of a material of the carrier 310. Thereby, as the light beams are reflected by the first side walls 314, the spatial radiation patterns having a desired scattering effect may be formed, and a light-mixing distance is shortened accordingly. By contrast, the light beams reflected by the second side walls 316 may construct the spatial radiation patterns having a desired converged effect, so as to increase the light-transmitting distance.

Figure 5:
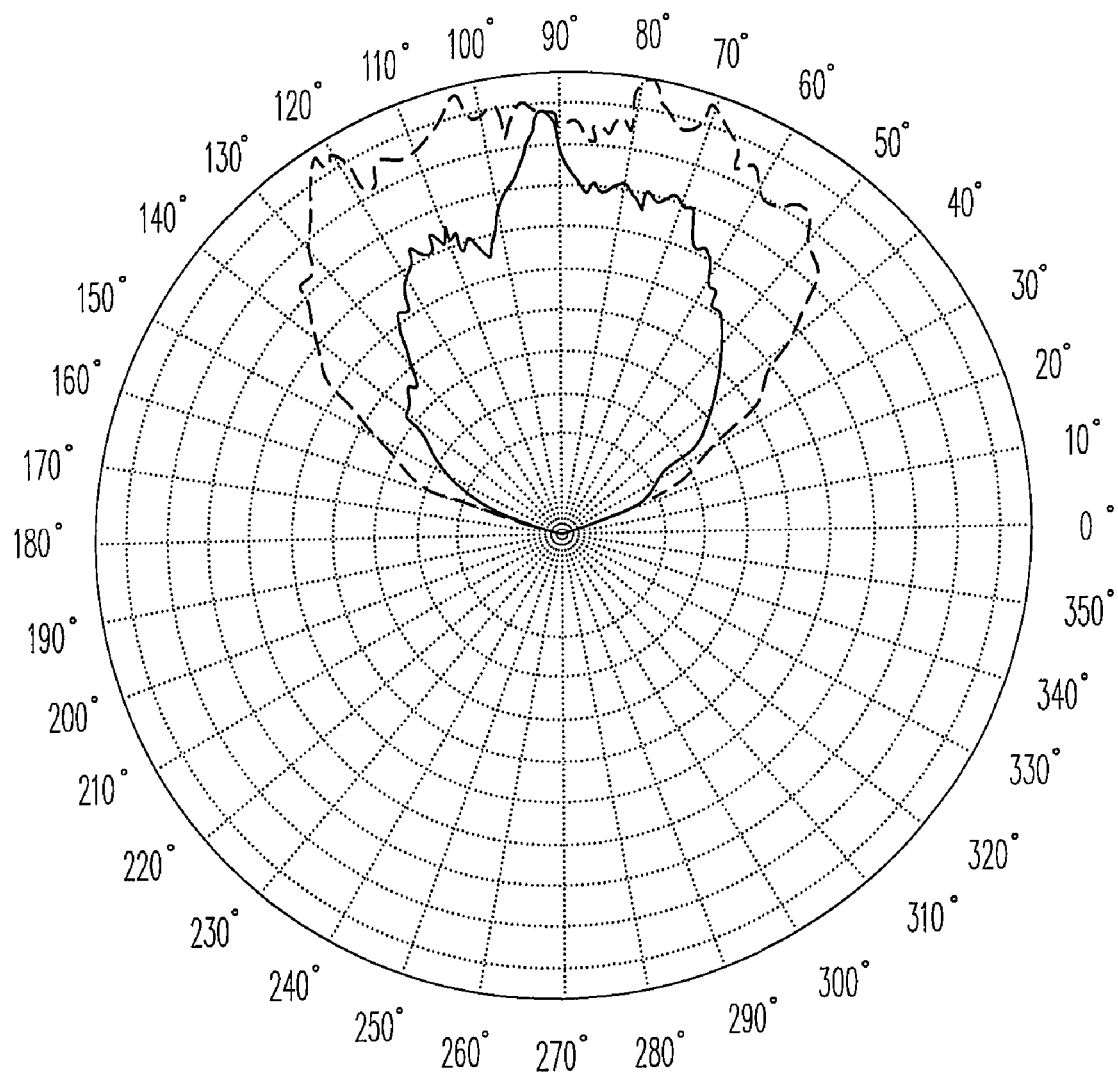
FIG. 5 is a diagram shows a curve relating light energy of light beams provided by the LED package structure of FIG. 4A to a scattering angle of said light beams.

In an embodiment of the present invention, the included angle $\alpha$ is 120 degrees, and the included angle $\beta$ is 138 degrees, for example. Besides, the number of the LED chips 320 is three, for example, and the LED chips 320 include a red LED chip, a green LED chip and a blue LED chip. Referring to FIG. 5, as the light beams provided by the LED chips 320 are reflected by the first side walls 314, the spatial radiation patterns having the desired scattering effect may be formed (as shown by dashed lines in FIG. 5). Accordingly, the light-mixing distance of a white beam mixed by the red light, the green light and the blue light is shortened. Furthermore, when the light beams provided by the LED chips 320 are reflected by the second side walls 316, the spatial radiation patterns having the desired converged effect may be constructed (as indicated by continuous lines in FIG. 5). Therefore, the light-transmitting distance is increased.

Here, as the light beams provided by the LED package structure 300 are transmitted at a distance up to 150 mm, the light intensity per unit is approximately 2.73. By contrast, when the light beams provided by the LED package structure 100c are transmitted to the same distance up to 150 mm, the light intensity per unit is approximately 2.1. As such, if the light beams provided by the LED package structures 300 are transmitted at the distance up to 150 mm, the light intensity per unit is approximately increased by 30%. Further, the light-mixing distance in the present invention is about 14 mm, which is shorter than the light-mixing distance (28 mm) required by the conventional LED package structures 100a.

It should be noted that the above embodiment is not intended to limit the present invention. For example, the LED package structure 300 may be made of plastic chip carriers, and the included angles $\alpha$ and $\beta$ can be adjusted on the basis of a material of the carriers. Thereby, as the light beams are reflected by the first side walls 314 and the second side walls, the spatial radiation patterns having the desired scattering effect and the desired converged effect may be formed, respectively. In the present embodiment, the carrier and the package body may be made of the same material including low-temperature co-fired ceramic (LTCC) or plastic leaded chip carrier (PLCC). The carrier and the package body may also be made of different materials which are not limited to those described hereinbefore. The LED package structures 300 may further include a plurality of leads 330, such that the LED chips 320 are electrically connected to other electronic devices (e.g. the circuit board 420 illustrated in FIG. 6) through the leads 330.

Figure 6:
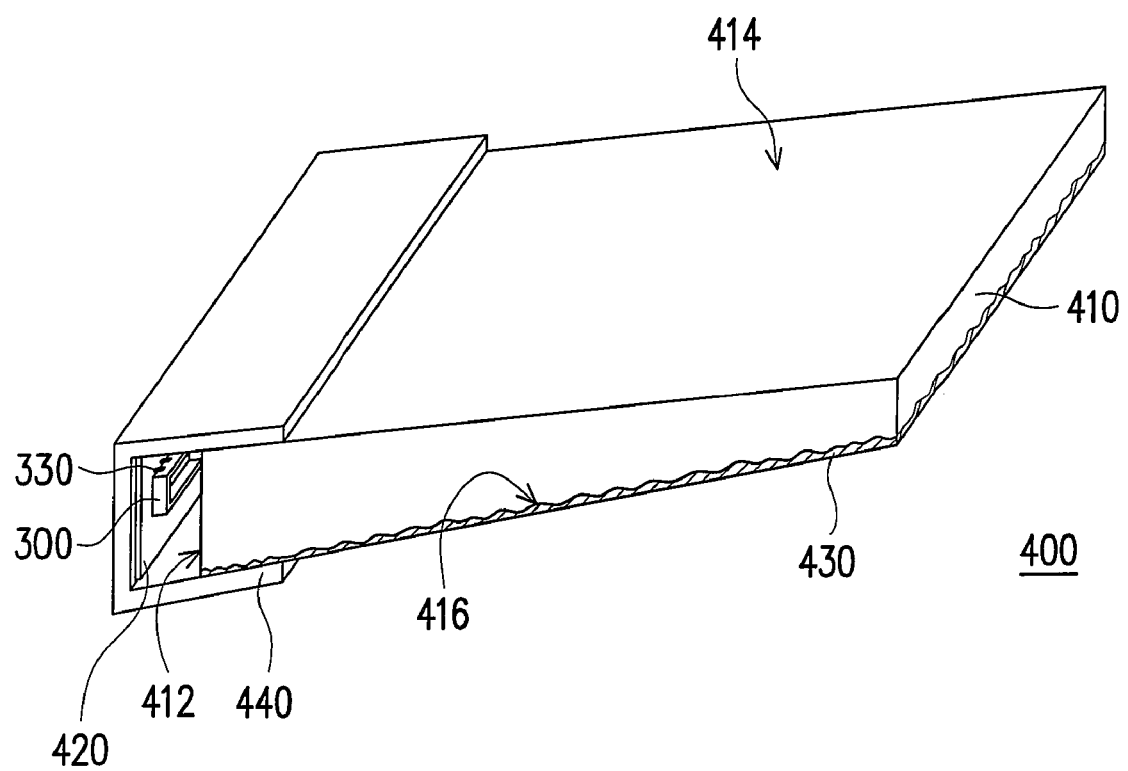
FIG. 6 is a schematic view illustrating a structure of a backlight module of the present invention.

Referring to FIG. 6, in an embodiment of the present invention, a backlight module 400 including a light guide device 410, a circuit board 420 and a plurality of said LED package structures 300 is provided. The light guide device 410 has a light incident surface 412 and a light emitting surface 414.

Each of the LED package structures 300 is electrically connected to the circuit board 420 and is adapted to provide a light beam incident into the light guide device 410 through the light incident surface 412. Here, each of the LED package structures 300 is electrically connected to the circuit board 420 through the leads 330, for example; the structure thereof is identical to that disclosed in the previous embodiment, and therefore will not be repeated hereinafter.

On the other hand, the backlight module 400 in the present embodiment is an edge-type backlight module, for example. Each of the LED package structures 300 is disposed in a straight-line arrangement on the circuit board 420, and the center lines 302 of the bottom surfaces of all the LED package structures 300 are parallel to one another, for example. Further, the light guide device 410 is, for example, a light guide plate, and it may be a wedge-type light guide plate, for example.

As the light beams provided by the LED chips 320 are reflected by the first side walls 314, the spatial radiation patterns having the desired scattering effect are formed. Hence, when a plurality of the LED package structures 300 is arranged in the straight-line arrangement on the circuit board 420, the light beams emitted from the LED package structures 300 may have a relatively short light-mixing distance after reflected by the first side walls 314. Besides, when the light beams provided by the LED chips 320 are reflected by the second side walls 316, the spatial radiation patterns having the desired converged effect are constructed. Therefore, the light beams provided by the LED package chips 320 may have a rather long light-transmitting distance after reflected by the second side walls 316, and favorable light uniformity may be achieved by the planar light source emitted from the light emitting surface 414.

It can be learned from the above embodiment that the backlight module 400 of the present invention not only can reduce its volume due to a relatively short light-mixing distance, but also can be applied to a large-sized display panel (not shown) by virtue of a rather long light-transmitting distance.

Aside from the above, the light guide device 410 has a light scattering surface 416 opposite to the light emitting surface 414, and the backlight module 400 may further include a reflective plate 430 disposed on the light scattering surface 416. The light scattering surface 416 is used to scatter the light beams irradiated into the light guide device 410, such that the light beams can be uniformly emitted from the light emitting surface 414. By contrast, the reflective plate 430 is adopted to increase the quantity of the light beams emitted from the light emitting surface 414. Moreover, the backlight module 400 may further include a reflective cover 440 disposed on the light incident surface 412, and the LED package structures 300 and the circuit board 420 are disposed between the reflective cover 440 and the light guide device 410, so as to reflect parts of the light beams provided by the LED package structures 300 to the light incident surface 412.

However, the present invention is not limited to the above embodiments. For example, the backlight module 400 may include a plurality of the reflective plates 430 disposed on at least one of the surfaces other than the light incident surface 412 of the light guide device 410 and the light emitting surface 414 thereof. Moreover, the light guide device 410 may have two opposite light incident surfaces 412 on which the LED package structure 300 may be disposed, such that luminance of the planar light source emitted from the light emitting surface 414 may be more desirable, and light uniformity may be more even. Alternatively, said arrangement enables the planar light source provided by the LED package structures 300 to be applied to the large-sized display panel.

In light of the foregoing, since the included angle between each of the first side walls and the bottom surface is different from that between each of the second side walls and the bottom surface in the present invention, the light beams provided by the LED package structure have the different spatial radiation patterns in different directions. The light beams reflected by the first side walls may construct the spatial radiation patterns having the desired scattering effect. Hence, as a plurality of the LED package structures is disposed together, the light beams provided thereby may have the relatively short light-mixing distance after reflected by the first side walls. Further, the volume of the whole backlight module can be reduced. Moreover, the light beams reflected by the second side walls may construct the spatial radiation patterns having the desired converged effect. Therefore, the light beams provided by the LED package structures may have a rather long light-transmitting distance after reflected by the second side walls.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A light emitting diode (LED) package structure adapted to a backlight module, the LED package structure comprising:

a carrier defining a cave with two opposite first side walls, two opposite second side walls and a bottom surface, each of the first side walls connecting a short side of the bottom surface, each of the second side walls connecting a long side of the bottom surface, wherein an included angle between each of the first side walls and the bottom surface is different from an included angle between each of the second side walls and the bottom surface, and the included angle between each of the first side walls and the bottom surface is larger than 90 degrees and less than the included angle between each of the second side walls and the bottom surface;

a plurality of LED chips disposed in a straight-line arrangement on a center line of the bottom surface and electrically connected to the carrier, wherein the center line is parallel to the long side of the bottom surface; and a package body formed on the carrier to cover the LED chips.

2. The LED package structure according to claim 1, wherein the included angle between each of the first side walls and the bottom surface is 120 degrees, while the included angle between each of the second side walls and the bottom surface is 138 degrees.

3. The LED package structure according to claim 1, wherein the carrier and the package body are made of the same material comprising low-temperature co-fired ceramic (LTCC) or plastic leaded chip carrier (PLCC).

4. The LED package structure according to claim 1, wherein the carrier and the package body are made of different materials.

5. The LED package structure according to claim 1, wherein the number of the LED chips is three, and the LED chips comprise a red LED chip, a green LED chip and a blue LED chip.

6. A backlight module, comprising:

a light guide device having a light incident surface and a light emitting surface;

a circuit board; and a plurality of LED package structures, wherein each of the LED package structures is electrically connected to the circuit board and adapted to provide a light beam incident into the light guide device through the light incident surface, and each of the LED package structures comprises:

a carrier defining a cave with two opposite first side walls, two opposite second side walls and a bottom surface, each of the first side walls connecting a short side of the bottom surface, each of the second side walls connecting a long side of the bottom surface, wherein an included angle between each of the first side walls and the bottom surface is different from an included angle between each of the second side walls and the bottom surface, and the included angle between each of the first side walls and the bottom surface is larger than 90 degrees and less than the included angle between each of the second side walls and the bottom surface;

a plurality of LED chips disposed in a straight-line arrangement on a center line of the bottom surface and electrically connected to the carrier, wherein the center line is parallel to the long side of the bottom surface; and a package body formed on the carrier to cover the LED chips.

7. The backlight module according to claim 6, wherein the LED package structures are disposed in a straight-line arrangement on the circuit board, and the center lines of the bottom surfaces of all the LED package structures are parallel to one another.

8. The backlight module according to claim 6, wherein the backlight module is an edge-type backlight module.

9. The backlight module according to claim 6, wherein the light guide device is a light guide plate.

10. The backlight module according to claim 9, wherein the light guide plate is a wedge-type light guide plate.

11. The backlight module according to claim 6, wherein the light guide device further comprises a light scattering surface opposite to the light emitting surface.

12. The backlight module according to claim 11, further comprising a reflective plate disposed on the light scattering surface.

13. The backlight module according to claim 6, further comprising a reflective cover disposed on the light incident surface, wherein the LED package structures and the circuit board are disposed between the reflective cover and the light guide device.

14. The backlight module according to claim 6, wherein the included angle between each of the first side walls and the bottom surface is 120 degrees, while the included angle between each of the second side walls and the bottom surface is 138 degrees.

15. The backlight module according to claim 6, wherein the carrier and the package body are made of the same material comprising LTCC or PLCC.

16. The backlight module according to claim 6, wherein the carrier and the package body are made of different materials.

17. The backlight module according to claim 6, wherein the number of the LED chips of each of the LED package structures is three, and the LED chips of each of the LED package structures comprise a red LED chip, a green LED chip and a blue LED chip.

* * * * *